United States Patent [19]
Farrow et al.

[11] Patent Number: 5,824,441
[45] Date of Patent: *Oct. 20, 1998

[54] LITHOGRAPHIC PROCESS FOR DEVICE FABRICATION UTILIZING BACK-SCATTERED ELECTRON BEAM SIGNAL INTENSITY FOR ALIGNMENT

[75] Inventors: Reginald Conway Farrow, East Brunswick; Masis Mkrtchyan, Stirling, both of N.J.

[73] Assignee: Lucent Technologies Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 753,855

[22] Filed: Dec. 3, 1996

[51] Int. Cl.$^6$ .......................................................... G03F 9/00
[52] U.S. Cl. .............................. 430/22; 430/30; 430/296; 430/942
[58] Field of Search ................................ 430/22, 30, 296, 430/5, 942

[56] References Cited

U.S. PATENT DOCUMENTS

| | | | |
|---|---|---|---|
| 5,260,151 | 11/1993 | Berger et al. | 430/5 |
| 5,279,925 | 1/1994 | Berger et al. | 430/5 |
| 5,316,879 | 5/1994 | Berger et al. | 430/5 |
| 5,376,505 | 12/1994 | Berger et al. | 430/5 |
| 5,382,498 | 1/1995 | Berger | 430/5 |
| 5,607,801 | 3/1997 | Nozue | 430/22 |

Primary Examiner—Christopher G. Young
Attorney, Agent, or Firm—Richard J. Botos

[57] ABSTRACT

The present invention is directed to a lithographic process for device fabrication. In lithographic processes for device fabrication, exposing radiation is used to delineate the image of a pattern into a layer of an energy sensitive resist material formed over a substrate. The pattern is then developed and the pattern is introduced into the underlying substrate. In the present invention, the substrate, typically a silicon wafer, is placed in a tool which utilizes electron beams as the exposing radiation. The silicon wafer has topographic alignment marks formed thereon. The alignment marks are used to orient the wafer in the tool accurately. The placement of the wafer in the tool is monitored by observing the intensity of the electron signal backscattered from the surface of the substrate. The alignment mark configuration is selected to provide a desired contrast between the intensity of the backscattered electron signal in the aligned state and the intensity of backscattered electron signal in the non-aligned state. The alignment mark dimensions that provide the desired contrast for a given intensity of incident electrons are selected by determining a relationship between backscattered electron signal contrast as a function of a dimensionless parameter that is the ratio of an alignment mark dimension (h) to the range (R) of the scattered electrons in the substrate. From this relationship, the desired backscattered electron signal contrast is selected. The value of the dimensionless parameter that corresponds to this data point is then used to determine the alignment mark dimension that will provide the desired backscattered electron signal contrast.

10 Claims, 3 Drawing Sheets

LITHOGRAPHIC PROCESS FOR DEVICE FABRICATION UTILIZING BACK-SCATTERED ELECTRON BEAM SIGNAL INTENSITY FOR ALIGNMENT

BACKGROUND OF THE INVENTION

1. Technical Field

This invention relates the field of lithography and in particular, a method for aligning the lithographic apparatus so that the exposing energy is directed onto the substrate in the desired location.

2. Art Background

Device fabrication technology is based on the use of lithography to create the features and patterns that make up the integrated circuit. Because many patterns are combined to form the integrated circuit, the substrate on which the device is formed must be precisely aligned with the lithographic apparatus to ensure that the pattern being introduced aligns properly with the other patterns already formed on the substrate as well as those patterns that are formed subsequently in the substrate. Alignment marks are typically formed on the substrate to assist in the orientation of the substrate, the mask pattern that is used to pattern the radiation introduced onto the substrate, and the optics of the lithographic apparatus.

Farrow, R. C. et al, "Marks for alignment and registration in projection electron lithography," *J.Vac.Sci.Technol.* B, Vol. 11(6), pp. 2175–2178 (1993) note the problems associated with mark detection in processes for fabricating devices with design rules of 0.25 μor less using projection electron lithography. Farrow et al. note that the detectability of the alignment marks depends upon the mark layout, the material used to fabricate the mark, the topography of the mark, and the operating conditions during mark detection. Farrow et al. used the measured flux from electron scattering events to detect the correct alignment conditions when the image of a mask mark is scanned over a corresponding wafer mark.

A mark detection scheme that is compatible with a high throughput projection lithography tool such as SCALPEL (Scattering with Angular Limitation in Projection Electron Lithography) is described in Farrow, R. C. et al, "Mark detection for alignment and registration in a high-throughput projection electron lithography tool," *J.Vac.Sci.Technol.* B, Vol. 10(6), pp. 2780–2783 (1992). A schematic of a projection electron lithography tool 10 that is used to practice this process is illustrated in FIG. 1. A set of marks 15 is fabricated on a substrate 20 (typically a silicon wafer). The marks 15 are made of a material with a backscattered electron (BSE) coefficient that is different from (i.e. either higher or lower than) the BSE coefficient of the underlying substrate 20. A mask (not shown) having a pattern that corresponds to the marks 10 is used to introduce a desired pattern into the substrate. The projection electron lithography tool 10 is also equipped with deflection coils 60 which shift the projected image (beamlets 70) from the mask, relative to the wafer marks 15. The mark pattern and the mark material are chosen so that alignment is detected by monitoring the BSE intensity with a BSE detector 80.

Farrow et al. note that the mark detection accuracy must be on the order of 0.1 of the total overlay budget. For 0.15 μm design rules, this translates to an accuracy of about 5 nm. Since the accuracy is affected by many factors such as mark geometry, signal to noise ratio and detector efficiency, a method for determining mark materials and configurations that provide accuracy within the desired parameters is desired.

SUMMARY OF THE INVENTION

In the process of the present invention, a mask and a substrate are aligned using topographic alignment marks in which the material and configuration thereof have been selected to obtain a desirable BSE signal contrast between an aligned and a non-aligned state (hereinafter referred to as BSE contrast). The process is used in a lithographic process for device fabrication in which an electron beam generator is the source of the exposing energy. Examples of such processes include projection electron beam lithography, shaped beam lithography, and direct write electron beam lithography.

The process of the present invention selects an alignment mark configuration that provides a significant contrast between the BSE intensity in the aligned state and the BSE intensity in a non-aligned state such that the difference between the signal in the aligned state versus the non-aligned state is observable over the noise in the backscatter signal. The configuration for the alignment marks is selected by determining the BSE signal contrast as a function of a dimensionless parameter that is the ratio of an alignment mark dimension (h) to the range (R) of the scattered electrons in the substrate. For topographic alignment marks, the ratio of h/R is associated with BSE signal contrast because the mark geometry provides the basis for the signal contrast. In the embodiment of the present invention wherein the alignment mark is a V-groove, the alignment mark dimension that is used to calculate the dimensionless parameter is the depth of the mark in the substrate.

R is a function of the substrate material and the energy of the electrons incident on the substrate and is determinable from these two known parameters. In the process of the present invention, by determining the BSE contrast as a function of the ratio h/R, an alignment mark dimension that provides an advantageous BSE contrast between a non-aligned and an aligned state is determinable.

In the process of the present invention, the BSE contrast from an alignment mark with a particular configuration is determined either empirically or by modeling. The BSE contrast is the ratio of the BSE intensity in the aligned state to the BSE intensity in the non-aligned state. If determined empirically, the BSE contrast from a series of alignment marks of a particular type (e.g. V-grooves or trenches) but with varying dimensions is observed to determine the relationship between alignment mark configuration and BSE contrast. The BSE contrast is monitored as a function of the ratio h/R. As previously noted, R is a function of the energy of the incident electrons and the substrate material on which the electrons impinge. R is either determined by referencing a table such as the one provided in Reimer, L., *Scanning Electron Microscopy*, p.100 (Springer-Verlag 1985) which is hereby incorporated by reference or by calculations well known to one skilled in the art.

The relationship between the BSE contrast and the above-described ratio, h/R, is then analyzed to determine the alignment mark dimensions that will provide a particularly desirable contrast between the aligned state and the non-aligned state. In particular, for any given BSE signal level required by the alignment process, the maxima in the relationship between BSE contrast vs. the ratio h/R (determined either empirically or by modeling) is a mechanism for determining the dimension of the alignment mark, h, that will provide the greatest amount of contrast under the conditions used to determine the relationship (i.e. for a given exposure energy and substrate material). If the alignment mark dimension(s) that correspond to the relationship maxima are not advantageous because a mark with such dimensions is difficult to manufacture or because the dimensions are not compatible with the tool or the process, the relationship between the BSE contrast and the ratio h/R is used as a guide to the selection of alignment mark dimensions that do not present these disadvantages. Specifically, the relationship is examined to determine a data point proximate to the BSE contrast maximum. Next, the alignment mark dimension (i.e. depth if the mark is a V-groove, width and depth if the mark is a trench) associated with this data point is determined. Once this determination is made, the alignment marks are introduced into the substrate and used in the lithographic process to align the substrate with the tool in the manner illustrated in FIG. 1.

In a further embodiment of the invention, the above described process for determining alignment mark dimensions is repeated using electrons with different incident energies. In order to accomplish this, the exposure tool or the energy source on the exposure tool are varied and the effect on the BSE contrast is observed. By varying the exposure energy one can determine not only the alignment mark that provides the desired contrast, but the exposure energy at which that contrast is further enhanced. For electron beam exposure tools, the range of exposure energies is about 10 keV to about 200 keV, but typically about 10 keV to about 100 keV. Therefore, in this embodiment, the exposure energy is varied among the exposure energies within the specified range.

In the embodiment of the present invention wherein the BSE contrast is modeled as a function of the above-described ratio, the BSE contrast is determined as a function of the alignment mark geometry, the energy of the incident electron beam, the position of the electron detector relative to the alignment marks on the wafer, and the material in which the alignment marks are formed. With regard to the properties of the material in which the alignment mark is formed, the average atomic weight, A, of the material in which the alignment mark is formed and the average atomic number, Z, of that material are used to model the BSE signal.

The BSE contrast is modeled by calculating the ratio $\gamma$ of the BSE intensity from the center of the alignment mark $\eta_c$ to the BSE intensity from the planar surface of the wafer $\eta_{2s}$ (i.e. since in the context of the present invention the alignment marks are topographic, the planar surface of the wafer refers to the non-topographic portion of the wafer surface adjacent to the alignment mark). Each of these signals has two components, a single scattering fraction and a diffusion fraction which are designated by the respective subscripts s and d. The relationship is summarized as: $\gamma=(\eta_{cs}+\eta_{cd})/(\eta_{\infty s}+\eta_{\infty d})$.

As previously described, these components of the modeled BSE contrast are determined from the spatial relationship between the detector and the alignment mark, the shape of the detector, the configuration of the alignment mark, the energy of the incident electrons, and the possible trajectories of the electrons backscattered from the alignment mark and into the purview of the electron detector. Once the BSE contrast is modeled for a variety of dimensions for a mark with a particular configuration, and the BSE contrast is then plotted as a function of the ratio of the depth of the alignment mark to the range of the electrons, the mark dimensions are selected in the same manner as described above for the empirically generated relationship between BSE contrast and the ratio of depth of mark to range of electrons.

In the process of the present invention, a desirable alignment mark configuration is first selected based on the compatibility of the expedient required to form the alignment mark with the overall process for forming the device. As noted in Farrow, R., et al., "Mark topography for alignment and registration in projection electron lithography," *SPIE,* vol. 2723, pp. 143–149 (March 1996), which is hereby incorporated by reference, a wet etching expedient such as potassium hydroxide is useful to form V-groove alignment marks in a silicon wafer. Trench-shaped alignment marks are formed using a plasma etch. Therefore, as a starting point, an alignment mark configuration is selected that is formed by an expedient that is compatible with the overall process for device fabrication.

The dimensions of the alignment mark are also selected to be compatible with the dimensions of the devices to be fabricated by the process in which the alignment marks are used. That is, if the critical dimension of the devices being fabricated is 0.1 $\mu$m, then it is advantageous if the width of the alignment marks are 0.1 $\mu$m or larger. The resolution limit of the tool is a practical lower limit on the width of the alignment mark. The scanning ability of the tool is a practical upper limit on the width of the alignment mark.

The alignment marks are introduced into the substrate, typically a silicon wafer or a layer of material overlying a silicon wafer which is commonly used in semiconductor device fabrication, using lithographic techniques well known to one skilled in the art.

The BSE intensity is a function of the detector take-off angle and the detector dimensions. Detectors with a variety of configurations (i.e., spherical, annular) are used in the process of the present invention. Since the detector dimensions affect the number of the backscattered electrons that are detected relative to the number of electrons that are not detected, the detector configuration is factored into modeling the BSE intensity. As illustrated in FIG. 2, the relationship between the alignment mark 210, the detector 215 and the electrons 220 that are incident on the alignment mark 210 at a ninety-degree angle with the substrate 225 define the region 230 in which backscattered electrons are detected. This region 230 is characterized by the detector solid angle 235 ($\Omega$) and the detector take off angle 240 ($\chi$).

As previously described, the desired alignment mark geometry is selected either by modeling the relationship of BSE contrast to the ratio of mark depth (h) to R, or by determining the relationship empirically by monitoring the backscattered intensity as a function of the ratio of h to R. Once this relationship is determined, an alignment mark with advantageous dimensions is selected and used in a lithographic process for device fabrication. Specifically, alignment marks are used to align a substrate on which devices are to be formed in an electron projection lithography tool. The aligned substrate is then subjected to a lithographic process, the lithographic process being a sequence of discrete steps in a process for fabricating integrated circuits.

DETAILED DESCRIPTION

The present invention is directed to a lithographic process for device fabrication that utilizes electron beam radiation to delineate a pattern in an energy sensitive resist material that is disposed on a substrate. The energy sensitive resist is used as an etch mask to transfer the pattern into the underlying substrate. Prior to the process step in which the pattern is delineated into the energy sensitive resist material, alignment marks are introduced into the layer of material underlying the resist material. These alignment marks are used to align the wafer with the lithographic apparatus to ensure that the pattern is introduced into the appropriate location on the wafer and in the appropriate orientation.

Figure 1:
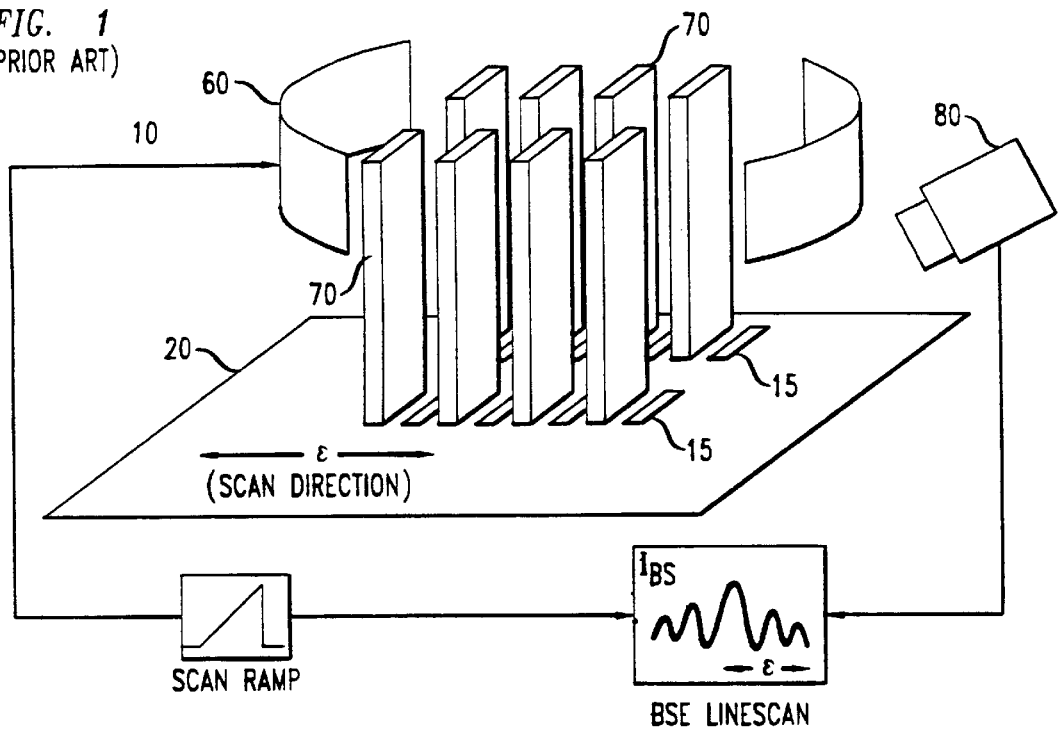
FIG. 1 is an illustration of a conventional method for using alignment marks to position a wafer in a projection electron lithography tool.
Figure 2:
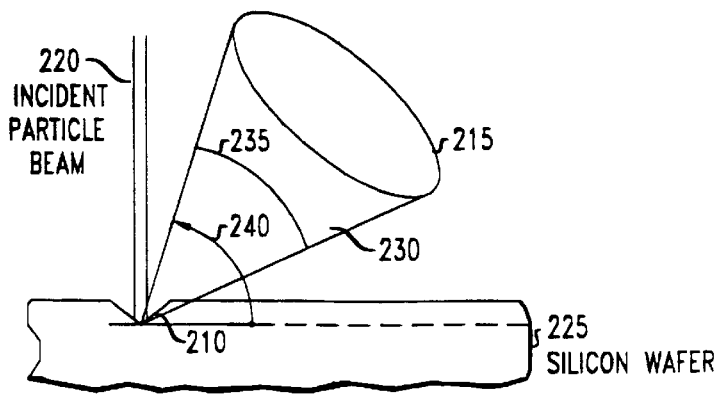
FIG. 2 illustrates the relationship between the alignment mark and the detector solid angle and the detector take off angle.
Figure 3:
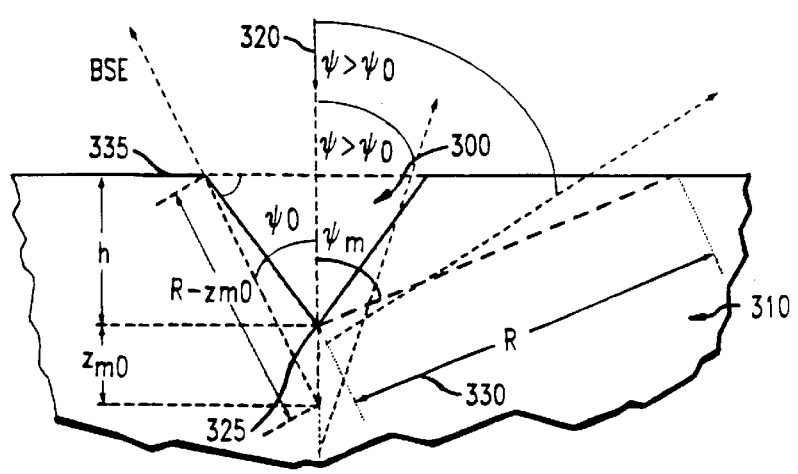
FIG. 3 illustrates the reflection of an electron beam incident of the center of a V-groove formed in a silicon wafer according to the single scattering model.

In one embodiment of the present invention, the BSE contrast for various ratios of h/R is modeled to determine the desired alignment mark configuration. The BSE contrast is modeled by calculating the ratio of the BSE intensity from the mark center to the BSE intensity from the horizontal wafer. These values are dependent on mark geometry, detector geometry, the material in which the mark is formed, and the spatial relationship between the mark and the detector. By way of example, these values are determined for a V-groove alignment mark 300 as depicted in FIG. 3. In FIG. 3, a V-groove groove 300 is formed in the surface of a silicon wafer 310. The electron beamlet 320 is incident on the center 325 of the V-groove 300. The angle in which electrons are backscattered from the V-groove is depicted as angle $\psi$, which varies from 0 to a maximum value $\psi_m$. The maximum value, $\psi_m$, is the maximum backscatter angle at which electrons have a reasonable probability of exiting the substrate.

The BSE contrast is calculated for a V-groove from the following equation:

$$\gamma_{sph} = (\eta_{cs} + \eta_{cd})/(\eta_{\infty}{}^s + \eta_{\infty}{}^d) \quad (1)$$

where $\gamma_{sph}$ is the BSE contrast for a hemispherical detector. The values of $\eta_{cs}$ and $\eta_{cd}$ are single scattered and rediffused back-scattered electrons from the center of the V-groove. The values of $\eta_{\infty}{}^s$ and $\eta_{\infty}{}^d$ are single scattered and rediffused back-scattered electrons from the horizontal surface of the wafer.

The value of $\eta_{\infty}{}^s$ is calculated using the following equation:

$$\eta_{2s}{}^s = (\beta - 1 + 0.5^\beta)/(\beta + 1) \quad (2)$$

in which the value $\beta$ is defined as follows:

$$\beta = 0.024 Z^2/A \quad (3)$$

where A is the average atomic mass for the material in which the V-groove is formed and R is the average range that electrons will travel through the substrate. This range, R, is depicted as 330 in FIG. 3. The value R is a function of the energy of the incident electron beam and the substrate material. One skilled in the art is aware that the value R is easily ascertained by consulting a reference table which provides values for R that correspond to a particular incident energy and a particular material. One example of a suitable reference is Reimer, L., *Scanning Electron Microscopy*, p.100 (Springer-Verlag 1985), which is hereby incorporated by reference.

The value of $\eta_{\infty}{}^d$ (the diffusive component of the backscattered electrons in the backscattered cone for the horizontal substrate surface) is calculated using the following equation:

$$\eta_{\infty}{}^d = \Omega/4\pi = 0.5 \times (1 - \cos\theta) \quad (4)$$

where $\theta$ is one-half of the apex angle (i.e., the semi-apex) of the backscattered cone 400 (FIG. 4) that is related to the value R and distance $z_c$.

Figure 4:
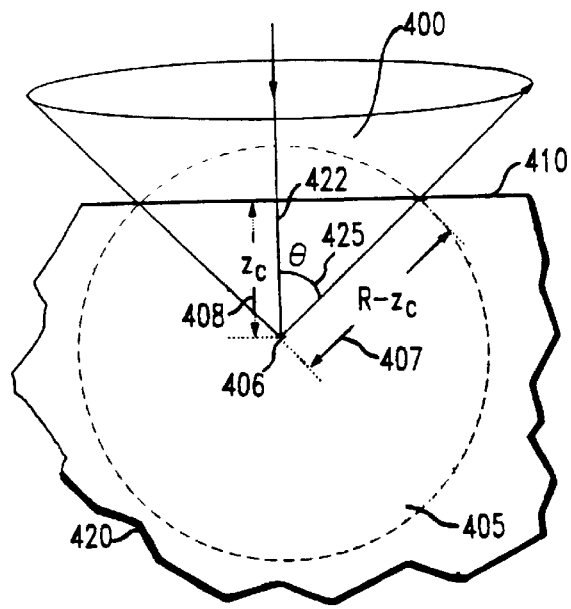
FIG. 4 illustrates the cone which defines the area into which electrons are backscattered from a horizontal bulk target according to the diffusion model.

The distance $z_c$ is defined as the average distance that an electron of a given energy penetrates the substrate before the electron begins to diffuse or backscatter in the substrate. The average diffusion distance is depicted by a diffusion sphere which has, at its center, the point in the substrate a distance $z_c$ below the point on the substrate surface on which the electron beam impinges. The diffusion sphere 405 is illustrated in FIG. 4. The value $z_c$ is depicted in FIG. 4 as the distance from the center of the diffusion sphere 405 to the surface 410 of the substrate 420 on a line 422 perpendicular to the substrate surface. The angle $\theta$ is depicted as 425 in FIG. 4. The sum of the distance $z_c$ and the diffusion sphere radius ($R-z_c$) is equal to R (the average distance that electrons of a given energy will travel through a given substrate material).

The semi-apex angle of the backscattered cone $\theta$ is calculated from the following equation:

$$\cos\theta = (\xi + \zeta)/(1-\zeta) \quad (5)$$

wherein $\xi$ is defined as the ratio of the depth of the alignment mark to R. Since, in the context of a flat substrate surface, $\xi$ is zero, equation (5) is simplified for the example illustrated in FIG. 4 wherein the diffusion cone is modeled for electrons backscattered from a non-topographic (i.e. planar) substrate surface.

The fraction of the rediffused electrons is defined by the dimensionless parameter $z_c/R$ and the following equation:

$$\zeta = z_c/R = 0.5 \times (1 - c_1{}^2 g^2/(1+g^2)) \quad (6)$$

where g is a function of E and Z (the average atomic number of the substrate) and $c_1$ is an adjustable constant. Both g and $c_1$ are obtained from Kanaya, K., et al., *J. Phys. D.: Appl. Phys.*, Vol. 11, p. 1495 (1978).

The value of $\eta_{cs}$ (the direct scattered component of the electrons scattered from the center of a V-groove) is calculated from the following equation:

$$\eta_{cs} = 2\pi \int_0^{\psi_m} f_{ss}(\psi) \sin\psi d\psi = 2\pi \int_0^{\psi_0} f_{s1}(\psi) \sin\psi d\psi + 2\pi \int_{\psi_0}^{\psi_m} f_{s2}(\psi) \sin\psi d\psi \quad (7)$$

wherein $\psi$ is the angle of the escape of the backscattered electrons and wherein $f_{s1}(\psi)$ and $f_{s1}(\psi)$ are the angular distributions of electrons for two subranges of $\psi$ (0 to $\psi_0$ to $\psi_m$, respectively). Angles $\psi_0$ and $\psi_m$ are illustrated in FIG. 3.

If the value of $h/R=\xi$ is less than or equal to sin α (the angle α is the angle of the V-groove 300 with respect to the planar substrate surface 335 as illustrated in FIG. 3) $\eta_{cs}$ is calculated using the following equation:

$$\eta_{cs}=2[(1-\zeta_{m0})(1+\xi)^{-1}-0.5]-[1+(1+\xi)^{\beta}](1+\beta)^{-1}\{[(1-\zeta_{m0})/(1+\xi)]^{(1+\beta)}-0.5^{\beta+1}\}+2(1+\xi)^{-1}\{\zeta_{mo}+[(1-\zeta_{m0})^{\beta+1}-1]/(1+\beta)\} \quad (8)$$

wherein β is calculated according to equation 3 above. If the value of $h/R=\xi$ is greater than sin α, $\eta_{cs}$ is calculated using the following equation:

$$\eta_{cs}=2(1+\sin\alpha)^{-1}-1-\{[1+(1+\sin\alpha)^{\beta}]/(1+\beta)\}[(1+\sin\alpha)^{-(1+\beta)}-0.5^{(\beta+1)}]. \quad (9)$$

Figure 5:
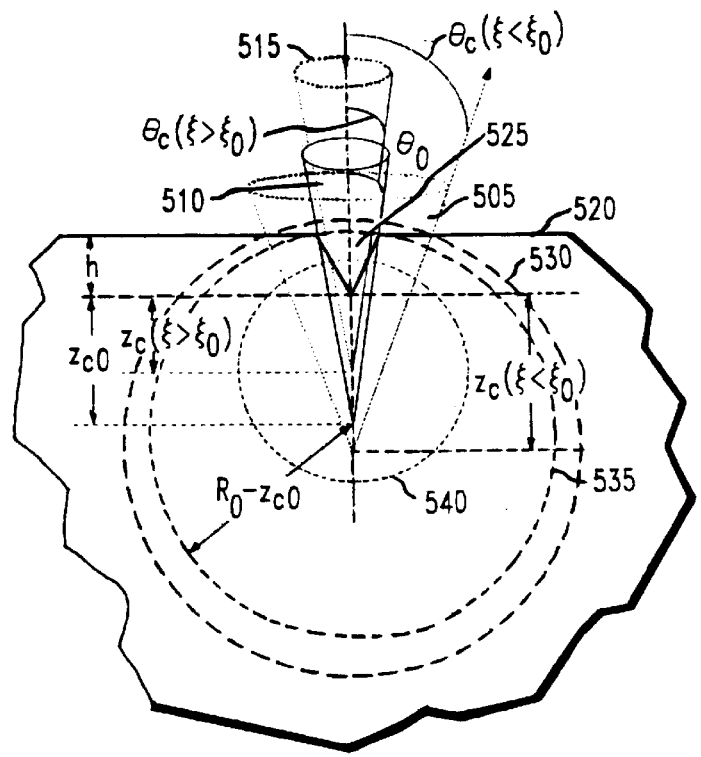
FIG. 5 illustrates the diffusion model of backscattered electrons from the center of a V-groove.

The value of $\eta_{cd}$ (the diffusive component of the backscattered electrons in the backscattered cone from the center of the V-groove) is determined using equations 4–6 as described above. As illustrated in FIG. 5, in the case of the V-groove, the value $\xi$ is no longer zero as it was for the horizontal surface. FIG. 5 illustrates the effect of the value $\xi$ on the diffusion cone. Diffusion cones for all three cases ($\xi<\xi_0$, $\xi=\xi_0$, and $\xi>\xi_0$) are illustrated in FIG. 5. The diffusion cones are indicated as 505, 510, and 515, respectively. FIG. 5 illustrates that the diameter of a cross-section of the diffusion cone at the substrate surface 520 is the same as the width of the V-groove 525 at the substrate surface when $\xi=\xi_0$. When $\xi>\xi_0$, the diameter of a cross-section of the diffusion cone 515 at the substrate surface 520 is less than the width of the V-groove at the substrate surface. When $\xi<\xi_0$, the diameter of a cross-section of the diffusion cone 505 at the substrate surface 520 is greater than the width of the V-groove 525 at the substrate surface 520. As illustrated in FIG. 5, the semiapex angle $\theta_c$ of the diffusion cone and, consequently, the rediffused backscattered component ($\eta_{cd}=0.5\times(1-\cos\theta)$), increases with increasing $\xi$ in the case of $\xi<\xi_0$ while it remains nearly constant in the case of $\xi>\xi_0$. Consequently, the more predictable model is when $\xi>\xi_0$ because, when $\xi<\xi_0$, the number of electrons that will contribute to the BSE intensity is more dependent on the energy of the incident electrons (E).

The greater predictability of the model when $\xi>\xi_0$ compared with the model when $\xi<\xi_0$ is further demonstrated by comparing equation (5), which is for values of $\xi<\xi_0$, with the following relationship for values of $\xi\geq\xi_0$:

$$\cos\theta=(\xi_0+\zeta)/(1-\zeta) \quad (11)$$

wherein $\xi_0$ is defined by the following equation:

$$\xi_0=\zeta\times\sin^2\alpha\times[(1+(1-2\zeta)/(\zeta\times\sin\alpha)^2)^{1/2}-1] \quad (12)$$

FIG. 5 demonstrates that, for a given V-groove geometry, the diffusion cone dimensions will vary with $\xi$. To model the diffusion cone for a particular V-groove, parameters in addition to the alignment mark geometry (e.g., the substrate material, the energy E of the incident electrons) are also considered. Therefore, in order to model the value of $\eta_{cd}$, conditions are selected that provide a value of $\xi_0$ for the geometry of a particular alignment mark.

The above-described relationships illustrate that the fraction of the electrons that rediffuse from the center of the V-groove is a function of the parameter $\xi=h/R$. The normalized diffusion depth $\zeta$ is a slow function of the energy of the electrons (E) incident on the center of the V-groove and a change in $\zeta$ does not have a significant effect on the value of $\eta_{cd}$. Most of the increase in $\eta_{cd}$ is in the range of $\xi<\xi_0$. The maximum value of $\eta_{cd}$ is when $\eta_{\infty}{}^d$ equals $(0.5-\zeta)/(1-\zeta)$. Consequently, if the depth of the V-groove (h) and the energy of the electrons (E) are selected to satisfy the condition $\xi>\xi_0$, then a greater contrast between the BSE intensity from the alignment mark and the BSE intensity from the flat substrate is obtained than if the values are selected so that this condition is not met. Equation 12 above indicates that $\xi_0$ is more a function of the substrate material than E. For example, for a silicon wafer, $\xi_0$ is about 0.1 to about 0.16 when E is in the range of about 10 keV to about 100 keV.

The above-described equations are solved for a spherical detector. The solution is then modified to model the BSE contrast that would be obtained if an annular detector is used to detect BSE intensity. An annular detector has a planar detector surface, while the spherical detector has a hemispherical configuration. The value $\gamma_{ann}$ is calculated from $\gamma_{sph}$ from the following equation:

$$\gamma_{ann}=F(\theta_1,\theta_2)\times\gamma_{sph} \quad (13)$$

where the function $F(\theta_1,\theta_2)$ reflects the fact that the annular detector (assuming it is installed symmetrically relative to the center of the V-groove) has inner and outer diameters. The detector will capture only those electrons backscattered into an angular range of $\theta_1\leq\theta\leq\theta_2$ where $\theta_1$ and $\theta_2$ are defined by the inner ($d_i$) and outer diameters ($d_o$) of the annular detector and the distance H between the detector and the substrate surface using the equations $\tan\theta_1=d_i/2H$ and $\tan\theta_2=d_o/2H$.

$F(\theta_1,\theta_2)$ is calculated for the case where the angular range of the backscattered electrons $\psi_u$ is greater than both $\theta_1$ and $\theta_2$ using the following equation:

$$F(\theta_1,\theta_2)=(\tan\psi_u-\theta_1)[\tan\psi_u-(\theta_2-\theta_1)/s(\theta_2,\theta_1)+t(\theta_2,\theta_1)/s(\theta_2,\theta_1)]^{-1} \quad (15)$$

$F(\theta_1,\theta_2)$ is calculated for the case where the angular range of the backscattered electrons is greater than $\theta_1$ but less than $\theta_2$ using the following equation:

$$F(\theta_1,\theta_2)=(\tan\psi_u-\psi_u)[\tan\psi_u\times s(\psi_u,\theta_1)/s(\theta_2,\theta_1)-(\psi_u-\theta_1)/s(\theta_2,\theta_1)+t(\psi_u,\theta_2)/s(\theta_2,\theta_1)]^{-1} \quad (15)$$

The functions s and t in the above equations are defined generally as:

$$s(a,b)=(\sin^2 a-\sin^2 b) \quad (16)$$

$$t(a,b)=(\sin a \cos a-\sin b \cos b) \quad (17)$$

wherein a and b are used as generic symbols for the variables which are used to calculate the functions s and t.

Figure 6:
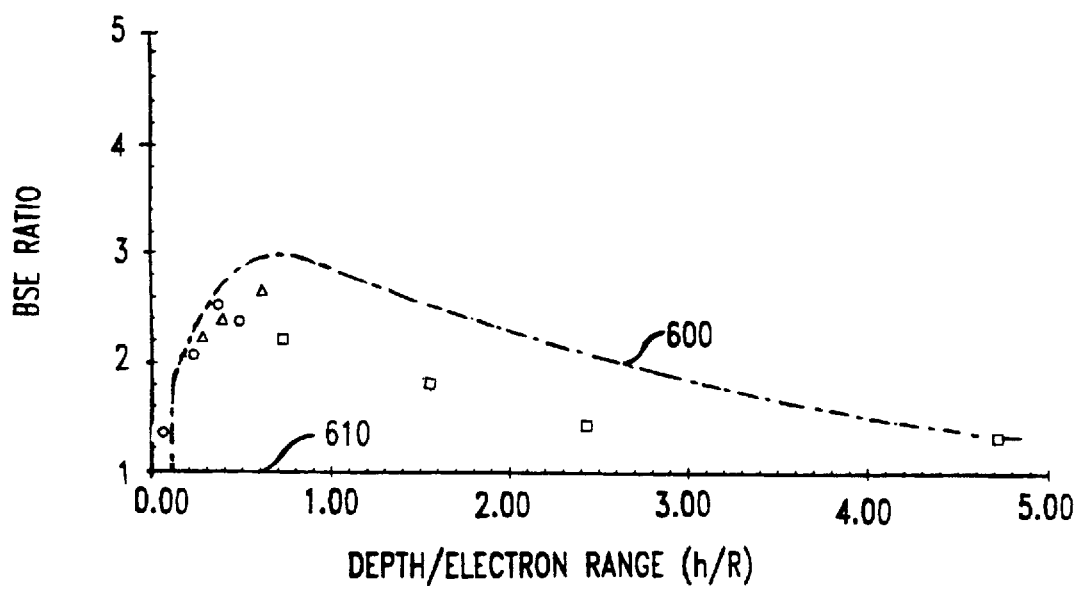
FIG. 6 illustrates the relationship between the BSE contrast and the ratio of h/R for different alignment mark dimensions and different exposure energies.

Once the BSE contrast is modeled for varying alignment mark dimensions and for varying energies E of incident electrons, the modeled BSE contrast is then plotted as a function of the ratio h/R. A modeled trace is illustrated in FIG. 6 and designated as dashed line 600. After the model trace is obtained, alignment mark dimensions are selected that provide the maximum model BSE contrast. Alignment mark dimensions are selected by observing the maximum in the function illustrated by the line 600. A value of h/R is selected which corresponds to this maximum. A value of h/R which corresponds to such a maximum in FIG. 6 is indicated by point 610. If the alignment mark dimensions that correspond to the maximum BSE contrast are impractical for some reason, a data point near point 610 that corresponds to alignment marks of more practicable dimensions is selected. For example, if the alignment mark dimensions that correspond to the data point 610 are not compatible with the process tolerances of the device fabrication process used to form the alignment marks on the substrate, the line 600 is used as a guide to a data point that corresponds to an alignment mark with dimensions that are more compatible with the process requirements. The closer the selected data point to the maximum value, the closer the BSE contrast that is obtained from the associated mark will be to the maximum BSE contrast that is provided by the function of BSE contrast vs. h/R.

EXAMPLE

The relationship between the ratio h/R and the BSE contrast for a V-groove alignment mark with varying dimensions was determined by fabricating V-grooves with varying depths into the surface of a <100> silicon wafer. The V-grooves were formed using e-beam lithography. A direct write electron beam lithography tool obtained from Cambridge Instruments was used for this purpose. A layer of energy sensitive material was formed over the silicon wafer. The silicon wafer had a layer of silicon dioxide with a thickness of 0.5 μm formed thereon. The image of features of varying widths were delineated into the resist using the direct write lithography tool. After development and transfer of these features into the underlying oxide (using standard lithographic techniques well known to one skilled in the art) the nominal widths of these features was 0.64 μm, 2.4 μm, 4.7 μm, 5.83 μm, and 8.9 μm, respectively. The remaining resist was then stripped from the surface of the wafer and the wafer was subjected to an anisotropic etch using a solution of potassium hydroxide to transfer V-grooves into the underlying silicon substrate. The depths of the resulting V-grooves was 0.45 μm, 1.7 μm 3.3 μm, 4.12 μm, and 6.3 μm, respectively.

The BSE contrast from these V-grooves was recorded using a Scanning Electron Microscope (SEM). The SEM was a JEOL 6300F with a field emission source. The BSE detector was an annular type with two semicircular regions. Measurements were take with the wafer a distance of 12 mm from the detector. The detector solid angle was 0.39 sr (steradians). The SEM measurements from the BSE detector were recorded on a digital oscilloscope. The image of the feature of interest was centered and oriented on the SEM monitor and the line profiles were recorded from 15 keV to 30 keV.

The incident energy on the alignment marks is summarized in Table 1 below. FIG. 6 is a graph of the BSE contrast vs. the dimensionless parameter h/R for the alignment marks. Different symbols were used in FIG. 6 to differentiate the BSE contrast that was observed at different incident energies. The symbols that correspond to a particular V-groove depth and incident energy is also indicated in Table 1.

TABLE 1

| V-groove depth (μm) | Incident Energy keV | Symbol in FIG. 6 |
| --- | --- | --- |
| 0.45 | 30 | circle |
| 1.7 | 30 | circle |

TABLE 1-continued

| V-groove depth (μm) | Incident Energy keV | Symbol in FIG. 6 |
| --- | --- | --- |
| 3.3 | 30 | circle |
| 4.12 | 30 | circle |
| 1.7 | 15 | triangle |
| 1.7 | 20 | triangle |
| 1.7 | 25 | triangle |
| 6.3 | 10 | square |
| 6.3 | 15 | square |
| 6.3 | 20 | square |
| 6.3 | 30 | square |

As noted from FIG. 6, the maximum value of BSE contrast from the empirical date corresponds to the same ratio of h/R as the data generated by modeling the data in the manner described above. As noted above, R is determined by reference to a table which provides values of R for a given material and a given energy of the incident electron beam. Alternatively, R can be calculated using equations such as those described in Valiev, K. A. *The Physics of Submicron Lithograhy,* p. 135 (Plenum Press 1992).

In lithography, the energy of the incident electrons is determined by the tool. For example, the energy of electrons for a projection SCALPEL system is about 70 keV to about 100 keV, the energy for direct e-beam systems is about 10 keV to about 100 keV, and the energy for shaped beam systems is in the range of 25 keV to 75 keV. Any value for the energy of the incident electrons, E, is useful for determining alignment mark configuration according to the process for the present invention. However, the alignment mark configuration is typically determined for the E for the particular tool, since E is typically not changed for a given tool. Once the relationship between BSE contrast and the ratio h/R is determined for a particular energy, E, of incident electrons, the relationship is examined for a maxima (i.e. point in the relationship at which the value corresponding to the BSE contrast is higher than the value of the BSE contrast on either side of the data point). Since each data point corresponds to a value of h/R, and R is calculated in the previously described manner, the depth of the alignment mark, h, that corresponds to a particular data point is readily determined.

Figure 7:
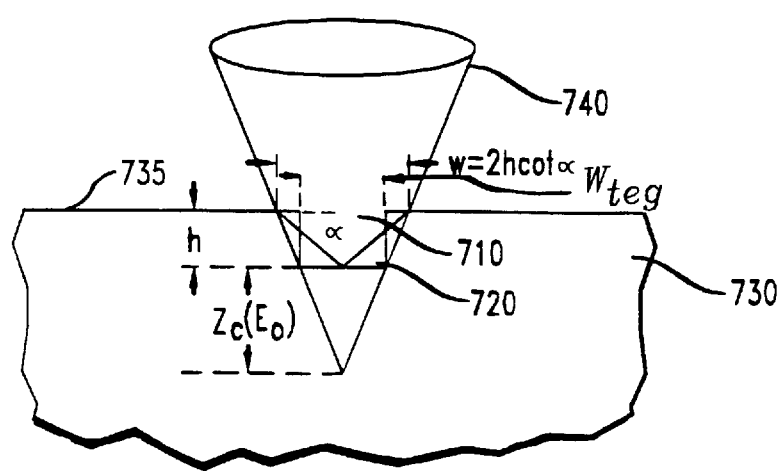
FIG. 7 illustrates how to determine the width and depth of a trench alignment mark that will provide a BSE signal contrast that corresponds to the BSE signal contrast provided by a V-groove alignment mark.

Although the present invention has been described in terms of an embodiment in which the depth of a V-groove type of alignment mark is determined, FIG. 7 illustrates that, once h is determined for a V-groove that provides the desired BSE contrast, the dimensions of a trench that will provide comparable BSE contrast are easily determined. Specifically, the depth of the trench 720 is the same as the depth of the V-groove 710. The width of the trench 720 is determined by the following equation:

$$\omega_{req} = (2h)(\cot \alpha)[z_c(E_o/(h+z_c(E_o))] = (2h)(\cot \alpha)[\zeta(E_0)/(\xi_0+\zeta(E_0))] \quad (18)$$

The angle α is the angle of the corresponding V-groove 710 with the planar surface of the substrate 730. As illustrated in FIG. 7, $\omega_{req}$ is a function of the depth of the V-groove (h) and the diffusion cone 740 that results when $E=E_0$. When $E=E_0$, the diffusion cone 740 has a width at the substrate surface 735 that is the same as the width of the corresponding V-groove 710 at the surface of the substrate 735.

What is claimed is:

1. A process for device fabrication comprising:
    placing a substrate with an energy sensitive layer of material thereon in a lithography tool having an electron beam generator and a backscattered electron detector;

aligning the substrate in the lithography tool by projecting a beam of electrons on the substrate surface and observing a signal associated with electrons backscattered from the substrate and determining from the signal whether the wafer is in the aligned state or the non-aligned state wherein the substrate has at least one alignment mark therein with at least one dimension selected by determining a relationship between a ratio of the backscattered signal intensity from the substrate in the aligned state to the backscattered signal intensity from the substrate in the non-aligned state and the ratio of the depth of the mark in the substrate (h) to the range of the scattered electrons in the substrate (R); selecting a desired ratio of the backscattered signal intensity from the substrate in the aligned state to the backscattered signal intensity from the substrate in the non-aligned state and selecting at least one mark dimension (h) that provides a desired contrast based upon the relationship.

2. The process of claim 1 wherein the relationship between the ratio of the backscattered signal intensity from the substrate in the aligned state to the backscattered signal intensity from the substrate in the non-aligned state and the ratio of the depth of the mark in the substrate to the range of the scattered electrons in the substrate is obtained for at least two topographic alignment marks with the same configuration, but wherein at least one dimension of the first alignment mark is different from at least one dimension of the second alignment mark.

3. The process of claim 2 wherein the ratio of the backscattered signal intensity from the substrate in the aligned state to the backscattered signal intensity from the substrate in the non-aligned state and the ratio of the depth of the mark in the substrate to the range of the scattered electrons in the substrate is obtained by placing a substrate with the alignment mark thereon in an electron beam exposure tool, subjecting the wafer to an incident beam of electron beam radiation and observing the intensity of the backscattered electron signal when the substrate is in an aligned state and the intensity of the backscattered electron signal when the subsrate is in a non-aligned state and calculating the ratio of the two intensities.

4. The process of claim 2 wherein the ratio of the backscattered signal intensity from the substrate in the aligned state to the backscattered signal intensity from the substrate in the non-aligned state and the ratio of the depth of the mark in the substrate to the range of the scattered electrons in the substrate is obtained by modeling the ratio of the intensity of the backscattered electron signal when the substrate is in an aligned state and the intensity of the backscattered electron signals as a function of the energy of an incident electron beam and the dimensions of the alignment mark.

5. The process of claim 4 wherein the modeled ratio is the ratio of the modeled intensity of the backscattered electron signal from the alignment mark in the substrate to the modeled intensity of the backscattered electron signal from a non-topographic substrate surface.

6. The process of claim 5 wherein the intensity of the backscattered electron signal from the alignment mark is the modeled intensity of the backscattered electron signal from the center of the alignment mark.

7. The process of claim 5 wherein the modeled intensity of the backscattered signal from the aligment mark is the sum of the modeled intensity of a scattering fraction and the modeled intensity of a diffusion fraction and the modeled intensity of the backscattered signal from the non-topographic substrate surface is the sum of the modeled intensity of a scattering fraction and the modeled intensity of a diffusion fraction.

8. The process of claim 1 wherein the lithography tool is a projection lithography tool.

9. The process of claim 1 wherein the lithography tool is a direct-write lithography tool.

10. The process of claim 1 wherein the lithography tool is a shaped-beam lithography tool.

* * * * *